United States Patent
Simpson

[19]
[11] Patent Number: 5,909,879
[45] Date of Patent: Jun. 8, 1999

[54] DIAMOND FILM COATING FOR MATING PARTS

[75] Inventor: Matthew A. Simpson, Arlington, Mass.

[73] Assignee: Norton Company, Worcester, Mass.

[21] Appl. No.: 08/028,473

[22] Filed: Mar. 9, 1993

[51] Int. Cl.$^6$ .................................................. F16J 15/20
[52] U.S. Cl. ........................................ 277/399; 277/404
[58] Field of Search .......................... 277/96, 96.2, 358, 277/399, 404

[56] References Cited

U.S. PATENT DOCUMENTS

| | | | |
|---|---|---|---|
| 4,093,243 | 6/1978 | Kishide et al. | 277/96.2 |
| 4,682,564 | 7/1987 | Cann | 118/620 |
| 4,704,332 | 11/1987 | Brennan et al. | 277/96 |
| 4,997,192 | 3/1991 | Nagai et al. | 277/96.2 |
| 5,009,676 | 4/1991 | Rue et al. | 51/309 |
| 5,129,688 | 7/1992 | McGarvey | 277/207 A |

FOREIGN PATENT DOCUMENTS

| | | |
|---|---|---|
| 0254312 | 1/1988 | European Pat. Off. . |
| 0469204 | 2/1992 | European Pat. Off. . |
| 2192483 | 7/1990 | Japan . |

OTHER PUBLICATIONS

R. D. Cadle, "Particle Size Determination" 1995, pp. 18–25 Interscience Manual.

W. J. P. van Enckevort, "Diamond Coatings", Journal of Hard Materials, vol. 1, No. 4, 1990, pp. 247–271.

Diamond and Related Materials, 1(1991) 1–12, "Towards a general concept of diamond chemical vapour deposition", Peter K Bachman et al. pp. 1–12.

CVD Diamond Filmsfor Tribological Applications, Chrystallyne Final Report Contract No. Noco 14–89–C–0151, Mar. 30, 1990, Plano et al. pp. 3–49.

*Primary Examiner*—Daniel G. DePumpo
*Attorney, Agent, or Firm*—Volker R. Ulbrich

[57] ABSTRACT

At least one of the mating wear surfaces of a sliding mechanical seal is coated with diamond. The coating includes an underlayer of high resistance to wear and an overlayer with a reduced resistance to wear as compared to that of the underlayer. The reduced wear resistance of the overlayer prevents damage by the diamond to the opposing mating surface during the wear-in period of use.

18 Claims, 2 Drawing Sheets

DIAMOND FILM COATING FOR MATING PARTS

FIELD OF THE INVENTION

The invention relates generally to wear parts and relates particularly, but not exclusively, to wear parts of mechanical seals.

BACKGROUND OF THE INVENTION

It is known to coat the wear surfaces of wear parts, such a seals, dies, engine parts, and other apparatus with a layer of material harder than the underlying material of the part in order to reduce the wear rate of the part. Diamond film deposited by CVD (chemical vapor deposition), as is described, for example, in "Diamond Coatings" by W. J. P. van Enckevort, *Journal of Hard Materials*, vol. 1, No. 4, 1990, pp 247–269, is particularly useful for this purpose, since diamond has not only great hardness but also a relatively low coefficient of friction.

Among the most severe applications for wear surfaces are various seals for rotating shafts to seal their passage through a wall. Typically such seals have mating flange members mounted on the shaft and on the wall, respectively. When in service, the flanges rotate against each other under mutual pressure and form a seal between their mating faces under these conditions. Polycrystalline diamond would appear to be an almost ideal material for use on the wear surfaces of rotary seals, since in addition to its above-mentioned favorable wear qualities, it also is quite resistant to most chemical corrosion. However, one problem with diamond in such an application is that if the surface of the diamond coating is not highly even and polished, even very small rough spots on the face can rapidly cause severe damage to the mating face, even if it too is coated with diamond. In most cases it is desirable that the second mating member not be coated with diamond, since such a coating is relatively expensive. Therefore, ceramic materials, such as silicon carbide, silicon nitride, aluminum oxide, or another ceramic or composite materials are often used. These materials are much softer than diamond and are immediately degraded by any roughness or unevenness of the diamond-coated opposing surface.

While the above problems can be dealt with by careful finishing of the diamond coating, such finishing is very expensive because of the hardness of the diamond. Also, in the course of the CVD growth process for the coating, there is a tendency for ever larger faceted crystallites to form as the layer increases in thickness. Individual ones of these faceted crystallites may protrude as asperities from the surface and cause severe damage when sliding against a mating surface. Such asperities are difficult to remove.

SUMMARY OF THE INVENTION

In accordance with the present invention, a novel wear part is made by applying to the wear surface a coating of diamond film having a surface region with reduced resistance to wear. This permits the coating to wear sufficiently against the mating surface without significantly damaging it to permit wearing in of the mating surfaces so that an optimum seal is formed. Once the surfaces are worn in, there is sufficient contact between the mating surfaces to prevent significant degradation of one surface by features of the other which might lie under the less wear resistant surface region.

DETAILED DESCRIPTION

Figure 1:
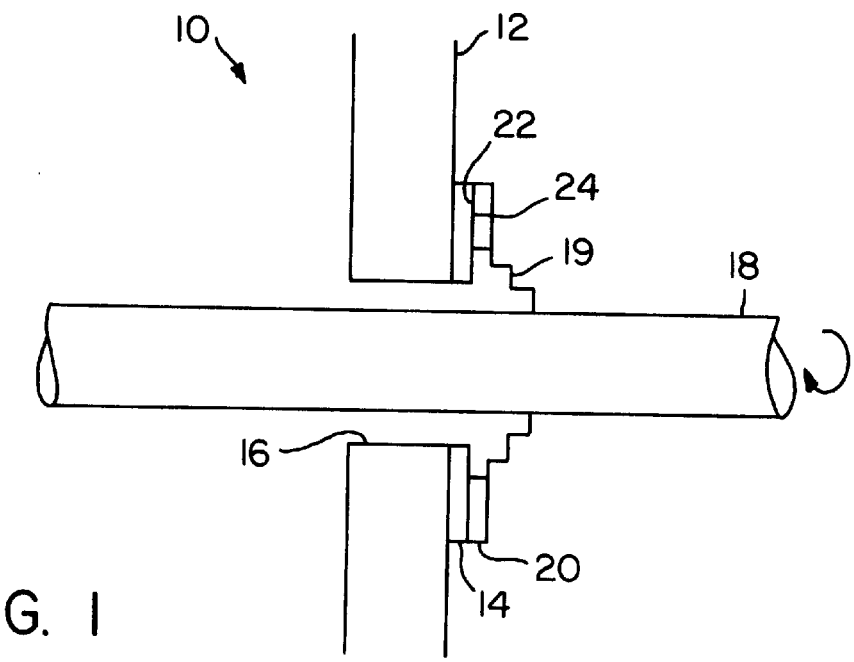
FIG. 1 is a schematic sectional view of a rotary seal assembly in accordance with one embodiment of the present invention.

One embodiment of a novel wear part in accordance with the present invention is the seal assembly 10 shown in FIG. 1. Referring now to the FIG. 1, the wall 12 of a housing has a sealing flange 14 mounted about a passageway 16 for a rotating shaft 18. Mounted on the shaft 18 by means of a bellows 19 is a mating sealing flange 20. The Flanges 14,20 have mating seal surfaces 22,24 pressed against each other by the resiliency of the bellows 19 to establish a seal between the seal surfaces 22,24. When such a seal assembly is in use as a fluid seal, a fluid film normally separates the seal surfaces 22,24 from each other. In startup or shutdown, on the other hand, the seal surfaces 22, 24 may be required to briefly run directly against each other with no intervening fluid film.

Figure 2:
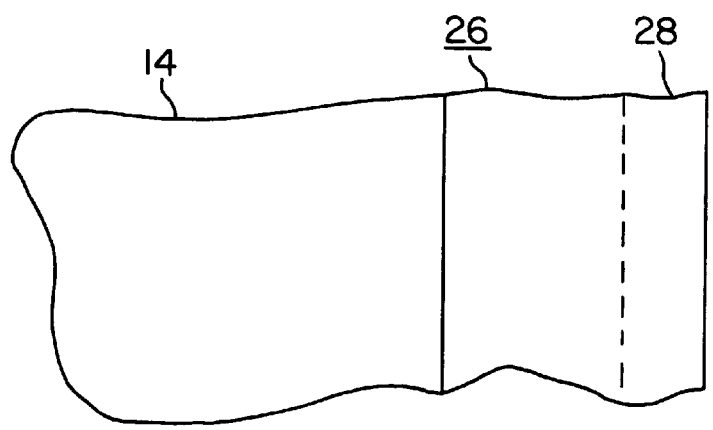
FIG. 2 is a schematic sectional view of a fragment of the seal assembly of FIG. 1.

A more detailed view of a fragment of the flange 14 is shown in FIG. 2. The seal surface 22 is provided with a coating of diamond film. The region 28 of the coating 26 near the surface is; deposited in such a manner that it has a reduced resistance to wear. This can be accomplished, for example, by increasing the concentration of carbon source gas, typically methane, in the diamond deposition process. Techniques associated with such deposition are described, for example, in "Towards a General Concept of Diamond Chemical Vapour Deposition" by Peter K. Bachmann et al in *Diamond and Related Materials* 1(1991)-12, Elsevier Science Publishers B.V. The thickness of this reduced wear resistance region 28 is typically from about 0.5 to about 10.0 microns (micrometers) and depends upon the degree of roughness present both in the surface of the diamond film coated flange and also the material and finish of the mating flange against which it runs. The coating 26 can be made progressively less resistant to wear as it grows thicker on the flange 14 material by, for example, progressively increasing the concentration of methane during the diamond deposition process. Another way of increasing the carbon activity possible under some growth conditions is to reduce the oxygen content of the deposition gas, as is suggested in the above-cited Bachmann reference.

Figure 3:
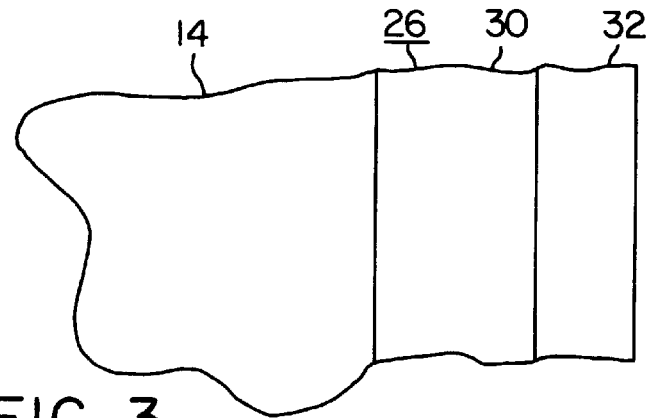
FIG. 3 is a schematic sectional view of a fragment of the seal assembly of FIG. 1 with a different coating structure.

An alternative coating for coating the flange 14 is shown in FIG. 3. Here the coating 26 is deposited as a first underlayer 30 on the flange 14 and a second, overlayer 32 on the underlayer 30. Of these, the overlayer 32 is less resistant to wear than is the underlayer 30. This is accomplished by abruptly increasing the methane concentration during the deposition process.

The mating flange 20 can be a different material or be also coated with diamond, which may or may not have a surface region of reduced resistance to wear.

EXAMPLE 1

A round silicon carbide ring 10 cm (centimeters) in diameter and 1 cm thick having a central opening 9 cm in diameter was coated in an arc jet reactor apparatus of the type described in U.S. Pat. No. 4,682,564 MAGNETO-PLASMADYNAMIC PROCESSOR, APPLICATIONS THEREOF AND METHODS issued Jul. 28, 1987 to Gordon L. cann. The deposition conditions were characterized by the following parameter values:

TABLE 1

| Reactor pressure | 25 torr |
|---|---|
| Deposition substrate temperature | 825 degrees C. |
| Enthalpy | 33 kilojoules/gram hydrogen |
| methane level (% in hydrogen) | 0.16 (condition A) |
| | 2.3 (condition B) |

The coating was accomplished using the following schedule:

TABLE 2

| Time after start | Condition |
|---|---|
| 0–15 mins. (minutes) | B1 |
| 15–60 mins. | A1 |
| 60–65 mins. | B2 |
| 65–105 mins. | A2 |
| 105–120 mins. | B3 |

The condition B1 establishes nucleation for the underlayer. The conditions A1 forms the underlayer, which is of diamond material with a highly faceted structure found to be particularly resistant: to wear. Condition B2 establishes a renucleation of the underlayer to maintain the size of the columnar microcrystallites small as the underlayer growth progresses. Condition A2 is for continued growth of the underlayer. Condition B3 establishes the growth contitions for the overlayer of less wear resistant diamond.

At the end of the coating period a coating about 8 microns thick was produced. A scanning electron microscope inspection of the film showed that the top surface structure was rounded, with a cauliflower-like structure having rounded lumps with major dimensions greater than 4 microns. The individual facets mostly had major dimensions less than 1 micron. Such a part would be considered suitable for use as a seal member for fluid seal applications.

GENERAL CONSIDERATIONS

Although the above-described embodiment of the invention pertains primarily to seals for rotating members, it will be recognized by those skilled in the art that the novel coating has application to any sliding wear surface, whether for a seal or for mechanical sliding friction bearings, such as bushings.

The overlayer should have a thickness of from 5–70% of the thickness of the whole coating. For a typical seal application, the thickness of the overlayer can be expected to be sufficient if it is about 0.5 micron. However, this depends upon the tolerance specifications of the application.

Figure 4:
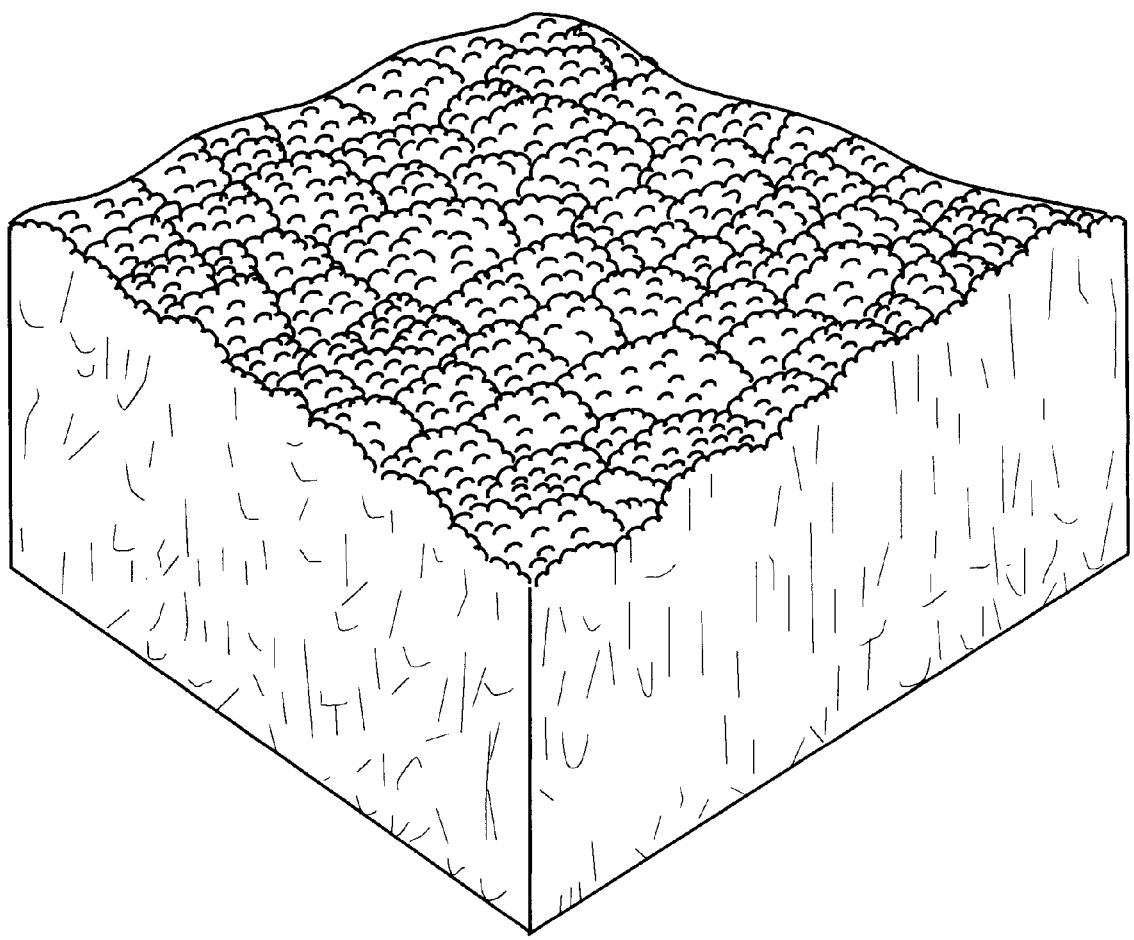
FIG. 4 is a schematic perspective sketch of a sectional fragment of diamond film of the type having a "cauliflower" surface.

It has been observed that diamond film material grown under the conditions B in table 2 above features a clumping together of crystallites into cauliflower-like lumps having major dimensions at: least four times the major dimensions of the individual crystallites. A schematic illustration of the surface of such a diamond film is shown in FIG. 4 of the drawings. Such cauliflower-like lumps have less resistance to wear than do the faceted crystallites which appear in the underlayer. Individual faceted crystallites of the underlayer can protrude from the surface and cause severe damage to the opposing surface. Removal of such features is difficult, since they are very hard. The provision of the material grown under conditions B over the underlayer covers these faceted crystallites to prevent them from damaging the opposing surface.

The selection of the appropriate thickness of the diamond layers will depend on the wear tolerances for the application. Generally, the total thickness of the diamond is determined by the maximum allowable wear. For example, in a spiral groove rotary seal of a type used on large natural gas compressors, the fluid dynamics are so important that the allowable wear is only about two microns. A total thickness of a few microns might suffice for this application. Journal bearings may also have small wear tolerances. On the other hand, a liquid pump seal may well tolerate more than ten microns of wear, so that a greater thickness of diamond would be useful for such a seal.

Selection of the thickness of the region of lower wear resistance of the diamond is somewhat dependent on the structure of the underlying diamond layer with greater wear resistance. The thickness of the lower wear resistance layer should be comparable or greater in dimension to the size of the diamond asperities in the underlayer, otherwise these asperities may be driven into the mating face. In some applications it may be desirable to interrupt the growth of the crystals in the underlying layer at least once to reduce the size of such asperities. A distinction should be maintained between the roughness of the substrate, which may benefit a sealing application, and the roughness of the greater wear resistance diamond layer, which may merely cause wear in the opposite face.

While in the above examples the reduction of wear resistance in the outermost region or layer of the diamond coating was accomplished by a change in the deposition conditions for the diamond, it would also be feasible to reduce the wear resistance of the diamond by introducing a foreign material into the deposited diamond. The inclusion of foreign material in deposited diamond is disclosed in, for example, European Patent Application 0 469 204 A1 of Kawarada et al filed 03.08.90.

The actual resistance to wear of a diamond coating is impractical to measure directly. Therefore, it is convenient for. quality assurance purposes to instead inspect the microstructure and infer therefrom the wear resistance based on experience with material having a similar appearance. A useful guide is to look at the top surface using an optical microscope or a scanning electron microscope. If the surface relief is caused mainly by individual faceted crystallites, then the wear resistance is likely to be( high. If the surface has a cauliflower-like structure and relief appears to be produced by lumps which consist of fine crystallites which may at times be too fine to be seen in ordinary microscopes, then the wear resistance is likely to be lower. A division between the two conditions can be established by estimating the ratio ore the lump size to the: if this is less than about four, it may be reasonably concluded that the intrinsic wear resistance has been appreciably reduced.

What is claimed is:

1. A mechanical member adapted to have at least a portion of its surface slidingly engaged as a wear surface by a mating surface, said member comprising:

a body having a wear surface, and a coating of polycrystalline diamond film on the wear surface, the coating having a first, outer thickness region of a first material remote from the underlying body and a second, inner thickness region of a second material under the first thickness region, the second material having a morphology different from that of the first material.

2. The member according to claim 1, wherein the resistance to wear of the coating progressively decreases with increasing thickness from the body to its outer surface.

3. The member according to claim 2, wherein the body is of metal.

4. The member according to claim 2, wherein the body is of ceramic.

5. The member according to claim 2, wherein the body is a seal surface component.

6. The member according to claim 5, wherein the seal surface component is for a rotating seal.

7. The member according to claim 1, wherein the coating comprises an underlayer of diamond on the body and an overlayer of diamond on the underlayer, the overlayer having a lower resistance to wear than does the underlayer.

8. The member according to claim 7, wherein the body is a seal component.

9. The member according to claim 8, wherein the seal component is for a sliding seal.

10. The member according to claim 7, wherein the underlayer has a thickness of from about 30% to about 95% of the coating.

11. The member according to claim 10, wherein the underlayer layer has a thickness of at least about 0.5micron.

12. The member according to claim 7, wherein the thickness of the overlayer layer is at least about 0.5micron.

13. The member according to claim 12, wherein the diamond material of the overlayer layer is characterized by a cauliflower morphology top surface with individual lumps having major dimensions generally more than 4times those of the individual crystallites of which the lumps are composed.

14. A seal assembly for a rotating shaft, comprising:
   first and second seal members having mating surfaces for mutually sliding engagement.
   at least the first member mating surface having a polycrystalline diamond film coating, the coating comprising at least an underlayer and an overlayer on the underlayer, the overlayer having less resistance to wear than the underlayer.

15. The member according to claim 4, wherein the overlayer has a thickness of from about 5% to about 70% percent of the combined thickness of the two layers.

16. The member according to claim 15, wherein the overlayer has a thickness of at least about 0.5 microns.

17. The member according to claim 14, wherein the thickness of the underlayer is at least about 0.5 microns.

18. The member according to claim 14, wherein the diamond material of the overlayer is characterized by a cauliflower morphology top surface with individual lumps having major dimensions generally more than 4times those of the individual crystallites of which the lumps are composed.

* * * * *